United States Patent [19]
Morikawa et al.

[11] Patent Number: 5,911,257
[45] Date of Patent: Jun. 15, 1999

[54] DEVICE FOR REMOVING OBJECTS ADHERED TO A PLATE FOR BONDING A SEMICONDUCTOR WAFER

[75] Inventors: Osamu Morikawa; Kiyoharu Miyakawa, both of Kanagawa, Japan

[73] Assignee: Komatsu Electronic Metals Co., Ltd., Kanagawa, Japan

[21] Appl. No.: 08/865,832

[22] Filed: May 30, 1997

[30] Foreign Application Priority Data

May 31, 1996 [JP] Japan .................................. 8-175344

[51] Int. Cl.⁶ .................................................. H01L 21/304
[52] U.S. Cl. ........................... 15/88.2; 15/77; 15/102; 279/106
[58] Field of Search .................... 15/88.2, 88.3, 15/77, 97.1, 102; 134/902; 279/106, 128

[56] References Cited

U.S. PATENT DOCUMENTS

| | | | |
|---|---|---|---|
| 2,613,943 | 10/1952 | Trudeau | 279/106 |
| 3,700,250 | 10/1972 | Bautz | 279/106 |
| 5,032,217 | 7/1991 | Tanaka | 134/902 |
| 5,093,550 | 3/1992 | Gerber et al. | 134/902 |
| 5,351,360 | 10/1994 | Suzuki et al. | 15/88.2 |
| 5,375,291 | 12/1994 | Tateyama et al. | 134/902 |
| 5,421,056 | 6/1995 | Tateyama et al. | 15/77 |
| 5,651,160 | 7/1997 | Yonemizu et al. | 15/77 |
| 5,675,856 | 10/1997 | Itzkowitz | 15/77 |
| 5,725,414 | 3/1998 | Moinpour et al. | 15/88.3 |

FOREIGN PATENT DOCUMENTS 4-150027  5/1992  Japan ................................... 134/902

Primary Examiner—Gary K. Graham
Attorney, Agent, or Firm—Sughrue, Mion, Zinn, Macpeak & Seas, PLLC

[57] ABSTRACT

A device for removing objects adhered to a plate for bonding a semiconductor wafer, which can efficiently and completely remove the objects adhered on the chamfered portion of the bonding plate. The rotating shaft 12 of the head for removing adhered objects from the peripheral surface is inclinatorily mounted with respect to the top surface 52 of the bonding plate 5. The peripheral chamfered portion 51 is not aligned with the extended line of the central line 12c of the rotating shaft 12. The upper peripheral surface 21a of the outer tip 21 of the chuck 2 is inclinatorily mounted.

6 Claims, 3 Drawing Sheets

DEVICE FOR REMOVING OBJECTS ADHERED TO A PLATE FOR BONDING A SEMICONDUCTOR WAFER

BACKGROUND OF THE INVENTION

1. Field of the Invention

The present invention relates to a cleaning device for removing objects adhered to a bonding plate that serves to bond a semiconductor wafer for polishing.

2. Description of the Related Art

In the manufacturing process in which a semiconductor wafer is bonded to a bonding plate for polishing, objects such as grindstone particles adhere to the surface of the bonding plate. In order to remove the adhered objects, after the semiconductor wafer is peeled off, the surface or inner side of the bonding plate is brought in contact with a polishing material such as a non-slip pad so as to remove the adhered objects.

However, in the process of removing the adhered objects on the surface or inner side of the bonding plate, the adhered objects on the chamfered portion of the peripheral portion of the bonding plate can not be removed. And if the bonding plate is used for a long time in such a condition, the adhered objects accumulate and then drop off, and thus the fragments thereof cause unevenness of the bonding surface of the semiconductor wafer, which prevents the semiconductor wafer from being polished completely flat.

Moreover, when the adhered objects on the chamfered portion of the bonding plate are to be removed, as no special purpose device is available, the bonding plate is taken out from the bonding process and the adhered objects are manually removed by using a scraper or a knife. This reduces the operation efficiency, the frequency of the manual removal is limited, and it is difficult to completely remove the adhered objects manually.

SUMMARY OF THE INVENTION

In view of the above-mentioned problems, the object of the invention is to provide a device for removing objects adhered to a bonding plate of a semiconductor wafer, which can efficiently and completely remove the objects adhered on the chamfered portion of the bonding plate.

Accordingly, the device for removing objects adhered to a bonding plate of a semiconductor wafer according to the invention includes means for rotating the bonding plate in a horizontal direction and a plurality of cleaning heads in contact with the bonding plate for removing the adhered objects on the surface of the bonding plate, wherein at least one of the rotating shafts of said cleaning heads is inclinatorily mounted with respect to a top surface of the bonding plate, and a portion other than the rotating center of each inclinatorily-mounted cleaning head, is in contact with a peripheral chamfered portion of the bonding plate.

Moreover, the cleaning device for removing objects adhered to a bonding plate of a semiconductor wafer according to the invention includes a chuck table rotatably mounted in a horizontal direction for carrying the bonding plate thereon, a plurality of chucks radially mounted with respect to the center of the rotating shaft of the chuck table for clamping the peripheral surface of the bonding plate, and a plurality of cleaning heads which are operative to come into contact with the bonding plate for removing the adhered objects on the surface of the bonding plate, wherein each of said chucks is L-shaped and has a tip portion which protrudes outward and upward and is shorter than the thickness of the bonding plate, said tip portion having an outer peripheral surface which is inclinatorily formed.

Instead of removing objects adhered to the peripheral chamfered portion of the bonding plate manually, according to the invention, a special cleaning head which contacts the peripheral chamfered portion is provided. The cleaning head does not interfere with the chucks for supporting the bonding plate, and thus the adhered objects of the peripheral chamfered portion can be efficiently removed. Accordingly, in the automated step of the bonding of semiconductor wafers, the objects adhering to the surface of the bonding plate can almost completely be removed.

BRIEF DESCRIPTION OF THE DRAWINGS

The embodiment of the present invention is hereinafter described with reference to the drawings, in which.

DESCRIPTION OF THE PREFERRED EMBODIMENT

Figure 2:
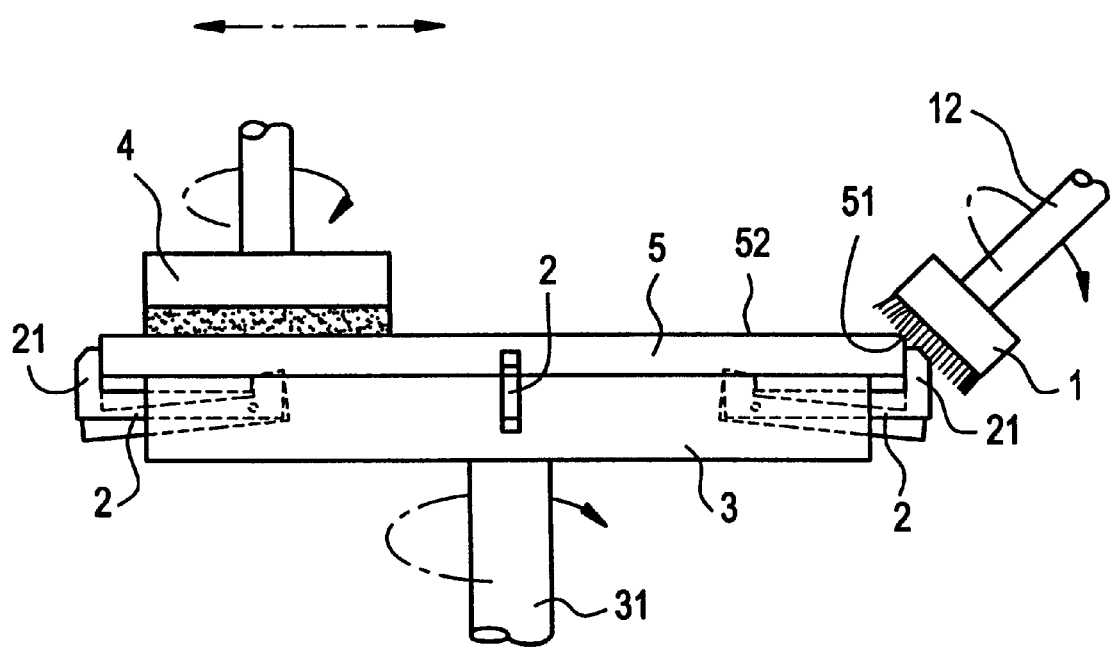
FIG. 2 is an elevational view of the removing device of the bonding plate in accordance with the invention.

Referring to FIG. 2, the cleaning device for removing objects adhering to a bonding plate of a semiconductor wafer of the embodiment includes a chuck table 3 rotatably mounted in a horizontal direction for carrying the bonding plate 5 thereon, a plurality of chucks 2 mounted on the chuck table 3, for clamping the bonding plate 5, a head for removing adhered objects from a peripheral surface in contact with the peripheral chamfered portion 51 of the bonding plate 5, and a head 4 for removing adhered objects from a top surface in contact with the top surface 52 of the bonding plate 5.

Figure 1:
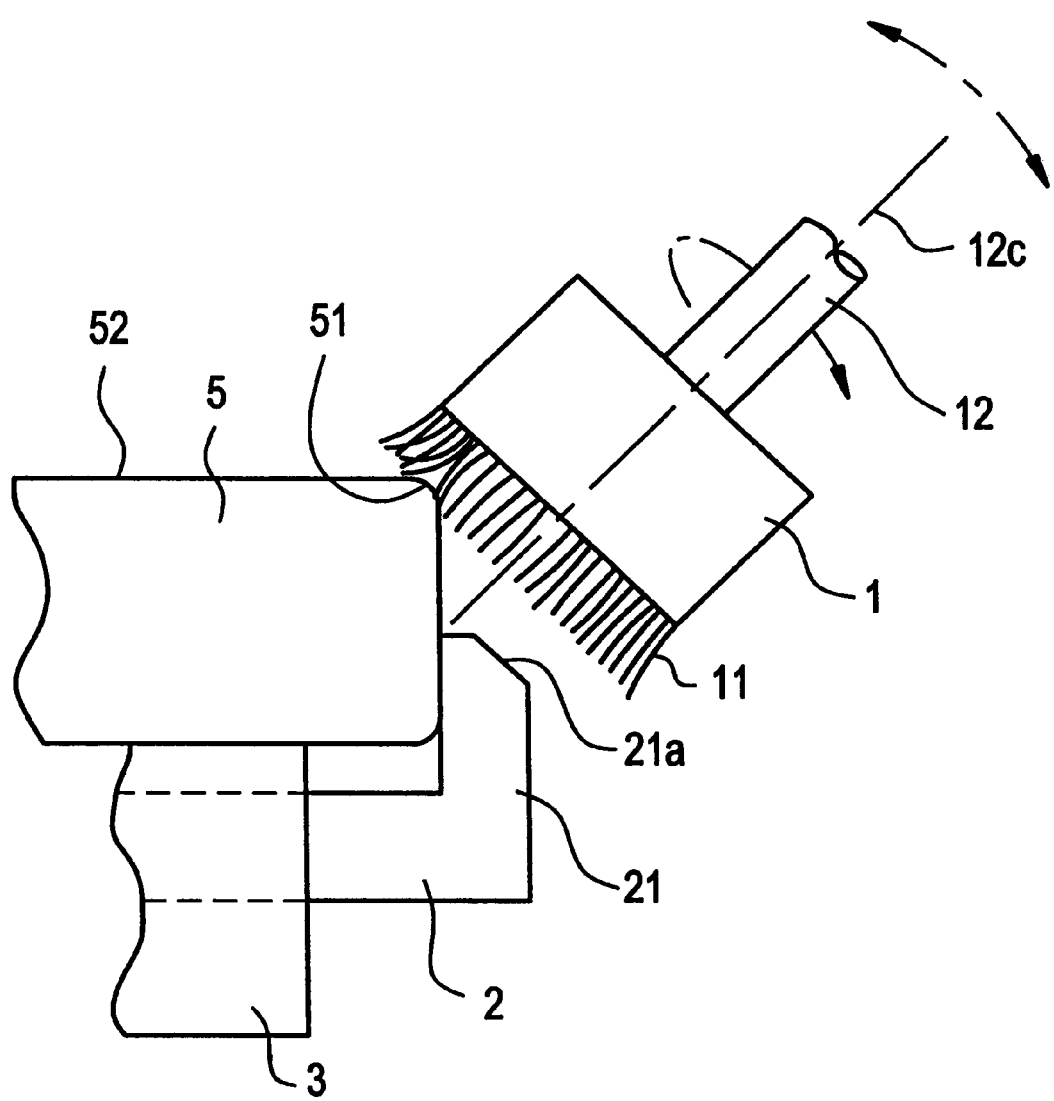
FIG. 1 is a partially elevational view of the removing device for adhered objects in accordance with the invention.

Referring to FIG. 1, the head for removing adhered objects from the peripheral surface is fixed on the tip of the rotating shaft 12 and its contacting surface with the bonding plate 5 is mounted with an abrasion resistant nylon brush 11. Accordingly, by contacting the peripheral chamfered portion 51 with the head for removing adhered objects from the peripheral surface while rotating the rotating shaft 12, the adhered objects (not shown) are removed.

The head 1 for removing adhered objects from the peripheral surface is so arranged that its rotating shaft 12 is inclined with respect to the top surface 52 of the bonding plate 5, and the peripheral chamfered portion 51 is not aligned with the extended line of the central line 12c of the rotating shaft 12.

Figure 3:
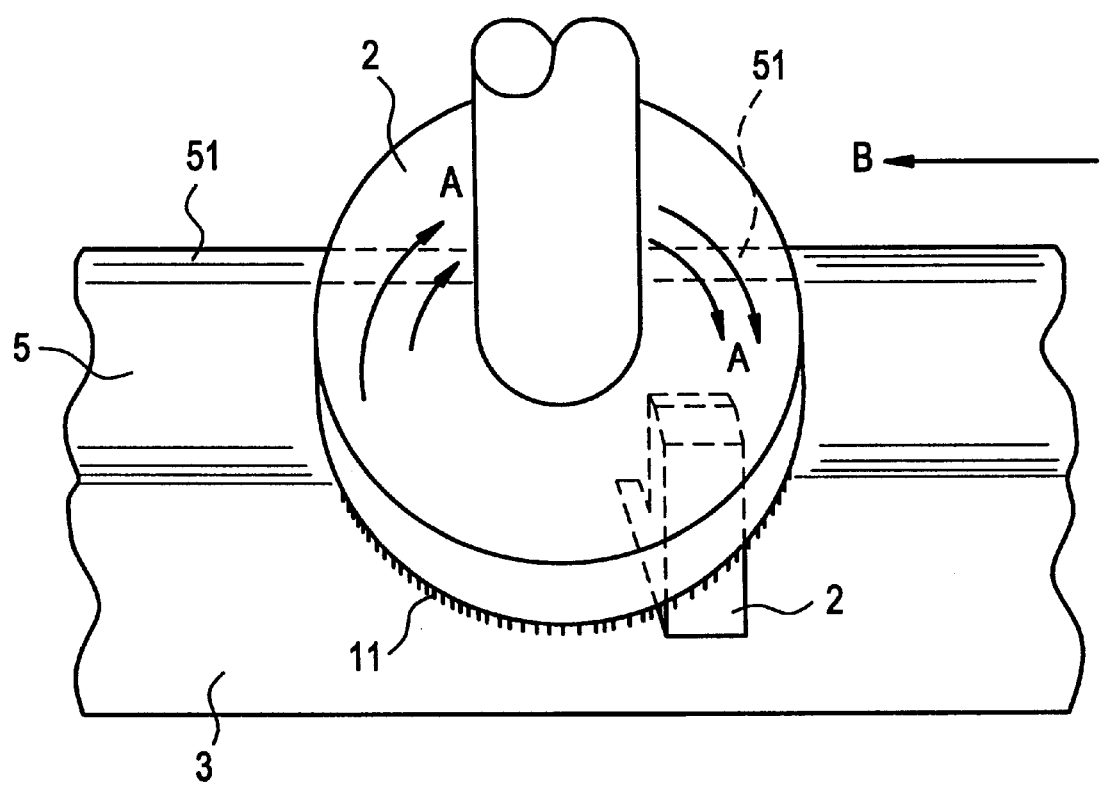
FIG. 3 is a partially enlarged view showing the contacting state of the bonding plate and the head for removing.

Accordingly, as shown in FIG. 3, the contacting surface of the head for removing adhered objects from the peripheral surface slides in a curved direction (arrow A), which is opposite to the horizontal direction (arrow B) in which the peripheral chamfered portion 51 is rotated. Thus, the nylon brush 11 removes the adhered objects while changing the sliding direction, and it is possible to remove the adhered objects efficiently.

Referring to FIG. 2, chucks 2 are radially mounted on the chuck table 3 with respect to the center of its rotating shaft 31 and each of the chucks 2 is L-shaped with its tip protruding upward. The mounting portions of the chucks 2 are pivotally and oscillatingly mounted so that when the bonding plate 5 is carried on the chuck table 3, it is clamped by the outer tips 21 of the chucks 2.

Referring to FIG. 1, the upper peripheral surface 21a of the outer tip 21 of each of the chucks 2 is inclinedly formed so that the nylon brush 11 of the head for removing adhered objects from the peripheral surface is not in contact with any of the chucks 2, and thus can prevent the interference between the chuck table 3 and the head for removing adhered objects from the peripheral surface.

Referring to FIG. 2, a head 4 for removing the adhered objects on the top surface 52 of the bonding plate 5 is rotatably and movably mounted with respect to the horizontal direction so that by rotating the bonding plate 5, all the adhered objects on the top surface 52 can be removed.

Referring to FIG. 1 again, the rotating shaft 12 of the head 1 for removing adhered objects from the peripheral surface is so mounted that the mounting angle can be adjusted. And thus by adjusting or changing the angle of the rotating shaft 12 in accordance with the the conditions of the adhered objects, the removal is performed.

Moreover, in the above embodiment, at the contacting surface of the head for removing adhered objects from the peripheral surface, is mounted with the nylon brush 11. However, as long as the material used for the brush has sufficient resilience for contacting with the curved peripheral chamfered portion 51 and abrasion resistance, for example, metal scrub or wire, the same effect can be obtained.

The invention is constructed as above. The removal is effected by making the nylon brush of the head for removing adhered objects from the peripheral surface change its sliding direction and thus the adhered objects on the peripheral chamfered portion of the bonding plate can be efficiently and almost completely removed.

Moreover, as the adhered objects on the top surface and the peripheral chamfered portion can be simultaneously removed, the removing device can be used in an automated step and the disadvantages occurring in the polishing according to the prior art can be avoided.

What is claimed is:

1. In a wafer cleaning system that includes a bonding plate for bonding a wafer in a horizontal direction and means for rotating the bonding plate, the bonding plate having a top surface and a peripheral chamfered portion, said system further including a device for cleaning the bonding plate, said device comprising:

a plurality of cleaning heads for removing objects adhered to a surface of the bonding plate, each of said cleaning heads being rotated by a rotating shaft about a rotating center and contacting the bonding plate to remove the adhered objects on the surface of the bonding plate; wherein at least one of the rotating shafts of said cleaning heads is inclinatorily mounted with respect to the top surface of the bonding plate so as to provide an inclined cleaning head, and a portion other than the rotating center of said included cleaning head is in contact with the peripheral chamfered portion of the bonding plate.

2. The system as claimed in claim 1, wherein said means for rotating the bonding plate comprises:

a chuck table rotatably mounted by a rotating shaft in a horizontal direction for carrying the bonding plate thereon; and a plurality of chucks radially mounted to said chuck table with respect to a rotary axis of the rotating shaft of said chuck table for clamping a peripheral surface of the bonding plate, wherein each of said chucks is L-shaped and has a tip portion which protrudes outward and upward and is shorter than a thickness of the bonding plate, said tip portion having an outer peripheral surface which is inclined downward with respect to the horizontal direction.

3. The system as claimed in claim 1, wherein a contacting surface of said inclined cleaning head, which contacts with the bonding plate, is formed with a material having resilience and abrasion resistance.

4. The system as claimed in claim 1, wherein a contacting surface of said inclined cleaning head, which contacts with the bonding plate, is formed with nylon.

5. The system as claimed in claim 1, wherein the angle of the at least one of the rotating shafts of said inclined cleaning head is changeable.

6. In a wafer cleaning system that includes a bonding plate for bonding a wafer in a horizontal direction and a chuck mechanism for rotating the bonding plate, the bonding plate having a top surface and a peripheral chamfered portion, said system further including a device for cleaning the bonding plate, said device comprising:

a plurality of cleaning heads for removing objects adhered to a surface of the bonding plate, each of said cleaning heads being rotated by a rotating shaft about a rotating center and contacting the bonding plate to remove the adhered objects on the surface of the bonding plate; wherein at least one of the rotating shafts of said cleaning heads is inclinatorily mounted with respect to the top surface of the bonding plate so as to provide an inclined cleaning head, and a portion other than the rotating center of said inclined cleaning head is in contact with the peripheral chamfered portion of the bonding plate.

* * * * *